United States Patent [19]

Mizutani et al.

[11] Patent Number: 5,043,785

[45] Date of Patent: Aug. 27, 1991

[54] PHOTOSENSOR DEVICE PHOTODIODE AND SWITCH

[75] Inventors: Hidemasa Mizutani, Sagamihara; Shigeki Kondo, Hiratsuka, both of Japan

[73] Assignee: Canon Kabushiki Kaisha, Tokyo, Japan

[21] Appl. No.: 572,355

[22] Filed: Aug. 27, 1990

Related U.S. Application Data

[63] Continuation of Ser. No. 232,153, Aug. 15, 1988, abandoned.

[30] Foreign Application Priority Data

Aug. 20, 1987 [JP] Japan ................. 62-206801
Aug. 20, 1987 [JP] Japan ................. 62-206804

[51] Int. Cl.$^5$ .......................................... H01L 27/14
[52] U.S. Cl. ........................................ 357/30; 357/32; 357/19; 357/59; 357/58
[58] Field of Search ............... 357/30 D, 30 G, 30 H, 357/30 R, 30 I, 30 P, 30 K, 30 S, 19, 58, 59 C, 59 D, 32

[56] References Cited

U.S. PATENT DOCUMENTS

| | | | |
|---|---|---|---|
| 3,535,532 | 10/1970 | Merryman | 357/30 G X |
| 4,236,831 | 12/1980 | Hendrickson | 357/59 D X |
| 4,346,395 | 8/1982 | Ouchi | 357/30 |
| 4,409,422 | 10/1983 | Sater | 136/244 |
| 4,733,286 | 3/1988 | Matsumoto | 357/30 I |

FOREIGN PATENT DOCUMENTS

| | | | |
|---|---|---|---|
| 0644569 | 7/1962 | Canada | 357/30 H |
| 60-223174 | 11/1985 | Japan . | |
| 61-89661 | 5/1986 | Japan . | |
| 62-67685 | 3/1987 | Japan . | |

OTHER PUBLICATIONS

Iguchi et al., "Lateral GaAs Photodetector Fabricated by Ga Focused-Ion-Beam Implantation", *Japanese Journal of Applied Physics*, vol. 25, No. 7, Jul. 1986, pp. 560-563.

Diadiuk et al., "Lateral Photodetectors on Semi-Insulating InGaAs and InP", *Applied Physics Letters*, vol. 46, No. 2, Jan. 15, 1985, pp. 157-158.

Seager et al., "Passivation of Grain Boundaries in Polycrystalline Silicon", *Appl. Phys. Lett.*, 3415), Mar. 1, 1979, pp. 337-340.

Bachner et al., "A Hybrid Integrated Silicon Diode Array for Visible Earth-Horizon Sensing", Lincoln Lab., MIT, Lexington, Mass., 1971, pp. 262-266.

Burov et al., "Photoelectric Resonant Gate Transistor (PRGT)", *Optical and Quantum Electronics*, 7 (1975), pp. 474-480.

*Primary Examiner*—William Mintel
*Attorney, Agent, or Firm*—Fitzpatrick, Cella, Harper & Scinto

[57] ABSTRACT

A photosensor device having a semiconductor layer disposed on a substrate. The semiconductor layer includes a lateral photosensor having a semiconductor junction arranged in a serpentine configuration and a lateral read-out switch. The lateral read-out switch and the lateral photosensor are formed on the semiconductor layer. The lateral photosensor has an area of a first conductivity type semiconductor and an area of a second conductivity type semiconductor. The lateral read-out switch includes an area of the first conductivity type and an area of the second conductivity type. The lateral photosensor and the lateral read-out switch are laterally adjacent, and substantially coplanar on the substrate.

24 Claims, 9 Drawing Sheets

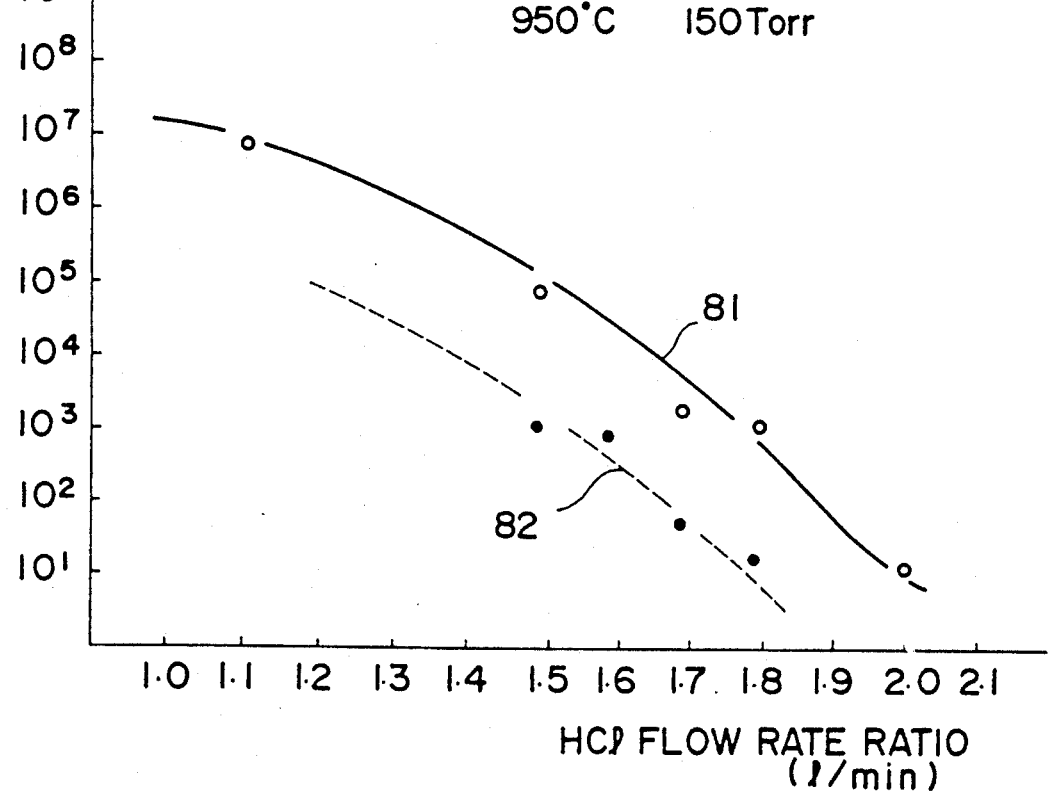

PHOTOSENSOR DEVICE PHOTODIODE AND SWITCH

This application is a continuation of application Ser. No. 07/232,153 filed Aug. 15, 1988, now abandoned.

BACKGROUND OF THE INVENTION

1. Field of the Invention

The present invention relates to a photosensor device for photoelectric conversion, and more particularly to a photosensor device for photoelectric conversion adapted for use for example in a long image sensor.

2. Related Background Art

Conventional photosensor devices, such as CCD, have been prepared by diffusion processes on a semiconductor substrate. Therefore the size thereof is limited, at maximum, to the size of the semiconductor substrate, and it has been difficult to obtain a long sensor array. Also in the case of forming the photosensor device on another substrate, as a system, there is required a process of adhering a separately prepared semiconductor sensor chip on the substrate, thus requiring a number of steps and resulting in a lowered accuracy of registration.

On the other hand, for obtaining wider freedom of selection of the substrate, there has been developed a photosensor device utilizing amorphous silicon. However, transistors based on amorphous silicon have been inevitably slow response time.

In order to overcome this drawback, there has been proposed, in the Japanese Laid-open Patent No. 59-126666, a method of forming a sensor portion with amorphous silicon and a transistor portion with polycrystalline silicon. However this method requires an increased number of steps and involves a high cost, since the photosensor based on amorphous silicon is prepared after the polycrystalline silicon transistor is prepared by an ordinary IC process.

In this manner it has been difficult to produce the photosensor device of satisfactory performance and low cost on a non-semiconductor substrate.

SUMMARY OF THE INVENTION

The object of the present invention is to provide an inexpensive photosensor device formed on an insulating substrate.

The above-mentioned object can be achieved, according to an embodiment of the present invention, by a photosensor device in which a semiconductor layer formed on an insulating substrate is composed of a first semiconductor area (e.g. 3, 13) of intrinsic type or one conductivity type and a second semiconductor area (e.g. 4, 24, 14) of the other conductivity type, wherein a horizontal type photosensor is formed by the junction of the first and second semiconductor areas. A field effect transistor constituting a processing circuit for the sensor signal is simultaneously formed with a source and a drain composed of said second semiconductor area (e.g. 14, 24) and a channel portion composed of said first semiconductor area (e.g. 13) positioned between said source and drain.

The first and second semiconductor areas are determined according to the object, application and design of the device. The horizontal type means that the junction of the first and second semiconductor areas constituting the photosensor is perpendicular to the surface.

Thus, a photosensor device of satisfactory performance can be obtained through a simple process, by forming the second semiconductor area in desired parts of the first semiconductor film formed on the insulating substrate, thus simultaneously forming the horizontal type photosensor and the field effect transistor (FET) at the junction of said semiconductor areas.

In another embodiment there is provided a photosensor device which is highly sensitive to the light having a shorter wavelength, by forming the horizontal type photosensor in a stripe structure.

In still another embodiment, there is provided a photosensor device which is highly sensitive to light having a shorter wavelength, by forming the photosensor in a horizontal structure and forming the base area thereof in a rectangular shape. The horizontal type structure of the photosensor facilitates formation of rectangular base portion.

BRIEF DESCRIPTION OF THE DRAWINGS

FIG. 8 is a chart showing the influence of nucleation density controlling gas on the nucleation density of large-grain polycrystalline silicon film;

DETAILED DESCRIPTION OF THE PREFERRED EMBODIMENTS

First Embodiment

Figure 1:
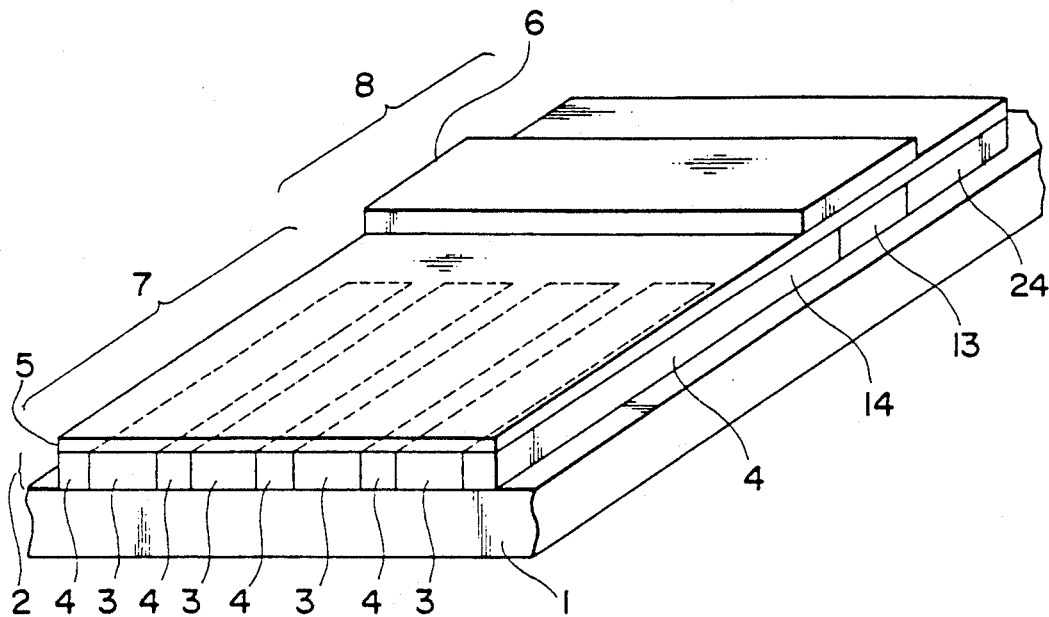
FIG. 1 is a perspective view of a photosensor device constituting a first embodiment of the present invention.
Figure 2:
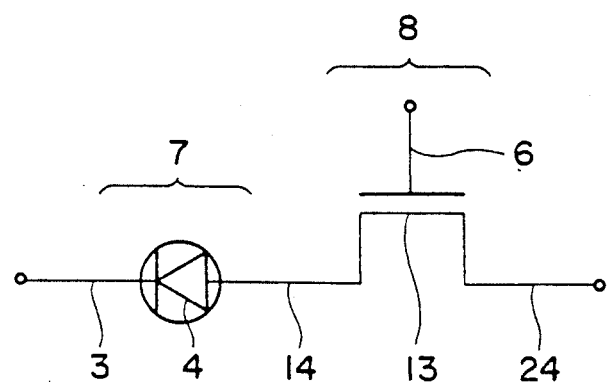
FIG. 2 is an equivalent circuit diagram of the photosensor device shown in FIG. 1.

FIG. 1 is a perspective view of a photosensor device constituting a first embodiment of the present invention, and FIG. 2 is an equivalent circuit diagram of the device shown in FIG. 1.

In FIG. 1, a thin semiconductor film 2 of n-type or i-type is formed on a substrate 1. The substrate 1 is composed of a transparent substrate such as quartz or glass if the device receives the light through the substrate. The first semiconductor film can be composed of polycrystalline silicon or monocrystalline silicon. The polycrystalline silicon can be of a grain size not exceeding 500 Å obtained by deposition with CVD under reduced pressure from ordinary silane ($SiH_4$) gas, but is preferably large-grain polycrystalline silicon proposed by the present applicant in the Japanese Patent Application Nos. 62-73629 and 62-73630 for realizing a photosensor device of higher performance. Also the monocrystalline silicon may be obtained by recrystallization with laser annealing or by monocrystal growth from a seed composed of a small $SiH_4$ pattern on $SiO_2$ followed by flattening. The large-grain polycrystalline silicon is most suitable for the present embodiment, due to the ease of the forming process. The large-grain polycrystalline silicon will be detailedly explained later. The film thickness is determined in consideration of the spectral sensitivity, but is generally in the order of 1 $\mu$m.

The semiconductor film of n-type or i-type explained above is doped with a p-type impurity, such as boron, in predetermined areas 4, 24, 14, down to the substrate. The diffusion can be achieved by gaseous diffusion from $BBr_3$ or the like utilizing a diffusion mask composed of $SiO_2$ or $Si_3N_4$ in an unnecessary area 3, or diffusion from a BSG film, or by ion implantation utilizing a photoresist mask.

Thus there are simultaneously formed a $P^+$-area 4 of a photosensor 7, and a source 24 and a drain 14 of a MOS-FET 8. The photosensor 7 composed of the $P^+$-n type horizontal photodiode has a striped arrangement of $P^+$-areas 4 and n-type or i-type areas 3. The horizontal type photodiode has a high spectral sensitivity for shorter wavelengths (blue side), since the absence of a high concentration layer at the surface of n-type or i-type area allows the utilization of the carriers, generated at the surface by the light of short wavelength, for generating a photocurrent without immediate recombination. Also in the large-grain polycrystalline silicon mentioned above, a larger photocurrent can be obtained with a smaller pitch of the stripe pattern, in consideration of the diffusion length of the carriers.

In the MOS-FET 8, source and drain areas 14, 24 of $P^+$-type are formed across the n- or i-type channel 13, and a gate insulator 6 is formed on a gate film 5 of a thickness of about 1000 Å. The gate insulator film is preferably composed of a thermally oxidized semiconductor film in consideration of the functional characteristic, but a $SiO_2$ film formed by CVD under reduced pressure or a $Si_3N_4$ film formed by plasma CVD may be substituted in consideration of the manufacturing cost. The gate is formed by depositing polycrystalline or amorphous silicon or aluminum and patterning it into a width so as to partially cover the source and drain areas as shown in FIG. 1. In FIG. 1 the contacts and wirings are omitted.

As will be apparent from the equivalent circuit shown in FIG. 2, the photosensor device of the present embodiment is capable of switching the output from the photodiode 7 of high sensitivity with the high-speed MOS-FET 8, so that a high-speed image reading is possible even when a sensor array is formed from a large number of sensor elements.

When an intrinsic semiconductor layer is employed, the channel area is preferably doped lightly with an n-type impurity.

In the following there will be explained the process of forming said large-grain polycrystalline silicon film.

FIG. 7 conceptually illustrates the growth of a large-grain polycrystalline film on a deposition plane of a $SiO_2$ film 71.

Figure 7A:
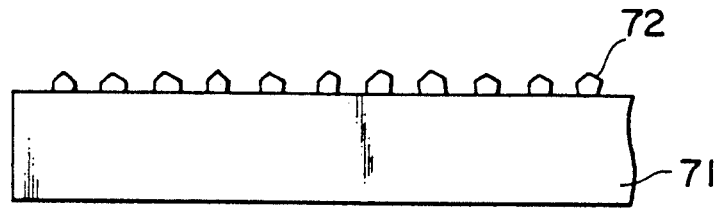
FIGS. 7A to 7C are schematic views showing crystal growth of a large-grain polycrystalline silicon film.
Figure 7B:
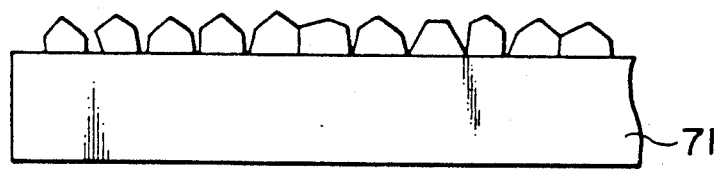
Figure 7C:
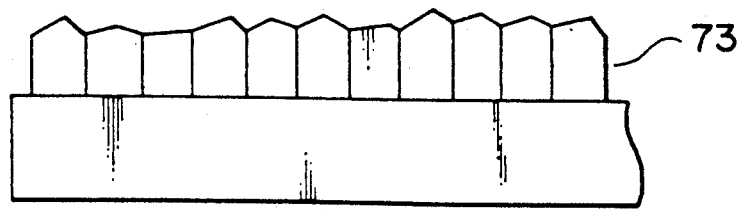

FIG. 7A shows a state in which nuclei 72 are formed; FIG. 7B shows a state in which the nuclei are grown into mutually contacting islands; and FIG. 7C shows a state in which a continuous film 73 is obtained by further growth. The nucleation density in FIG. 7A depends greatly on the interaction between the incoming atoms and the deposition surface, but also on the depositing conditions such as gas species, pressure and temperature.

FIG. 8 shows the change in the nucleation density ($N_D$), in the formation of silicon nuclei on a $Si_3N_4$ or $SiO_2$ film, as a function of the flow rate ratio of HCl as a depositing parameter. The $Si_3N_4$ film was formed by low pressure CVD, while the $SiO_2$ film was formed by normal pressure CVD. There were employed $SiH_2Cl_2$ as source gas and $H_2$ as carrier gas, and the reaction was conducted under a reduced pressure of about 150 Torr with a composition $SiH_2Cl_2:HCl:H_2 = 1.2:x:100$ (l/min), with a substrate temperature of 950° C. Curves 81 and 82 respectively show the nucleation density on the $Si_3N_4$ film and the $SiO_2$ film. As will be apparent from FIG. 8, the nucleation density is governed by the deposition surface, but is more strongly dependent and is controllable by the flow rate ratio (mixing ratio) of HCl. Consequently HCl can be considered as a nucleation density controlling gas.

Figure 9:
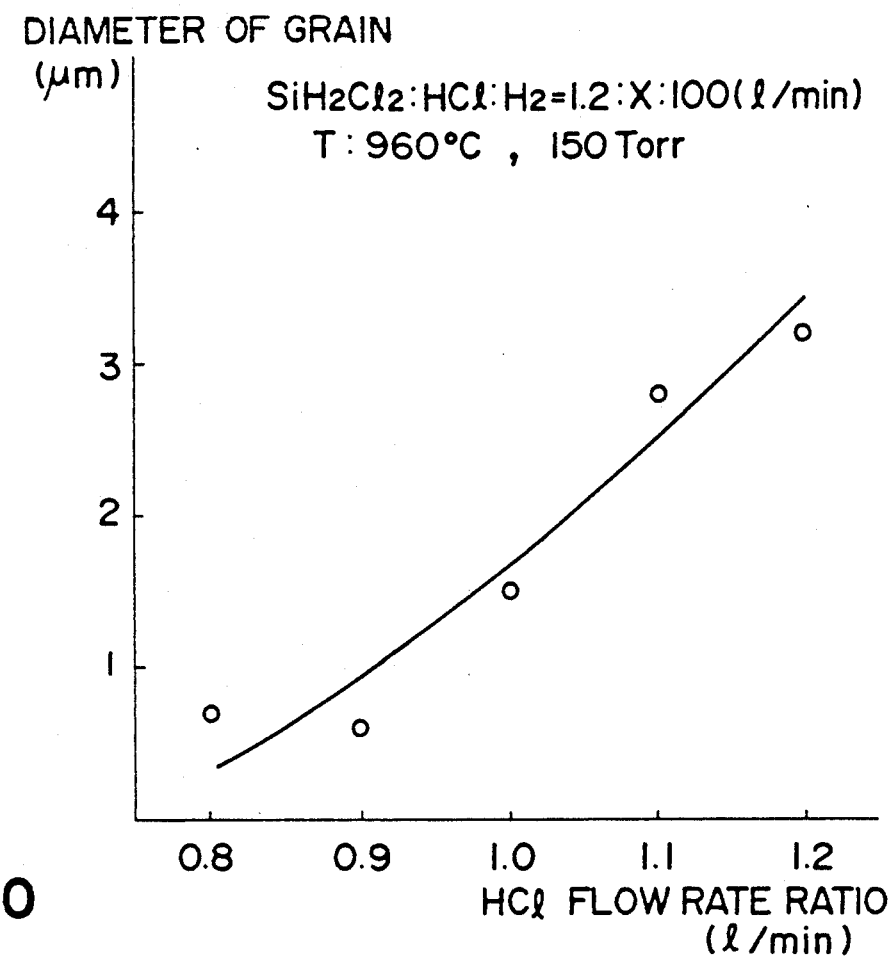
FIG. 9 is a chart showing the influence of nucleation density controlling gas on the crystal size of large-grain polycrystalline silicon film.

FIG. 9 shows the relationship between the amount of HCl and the average grain size. A large-grain polycrystalline silicon film with an average grain size of 3 $\mu$m could be obtained by the deposition for 30 minutes with a HCl flow rate of 1.1 l/min which corresponds to a nucleation density of $10^7/cm^2$. Since the average grain size is inversely proportional to the square root of the nucleation density, an average grain size exceeding 1 $\mu$m can be obtained by maintaining the nucleation density at $10^8/cm^2$ or lower.

However, the grain size becomes uneven if the nucleation density is significantly low, because of a statistical fluctuation and a fact that the distance between nuclei becomes no longer negligible with respect to the diffusion length of silicon atoms on the deposition surface. A nucleation density equal to or higher than $10^6/cm^2$, or an average grain size equal to or lower than 10 $\mu$m was experimentally confirmed practical for the actual semiconductor device formation.

As shown in FIG. 8, the $SiO_2$ film, showing a nucleation density lower by about two digits than that on the $Si_3N_4$ film, is suitable for obtaining a polycrystalline film of larger grain size.

Figure 10:
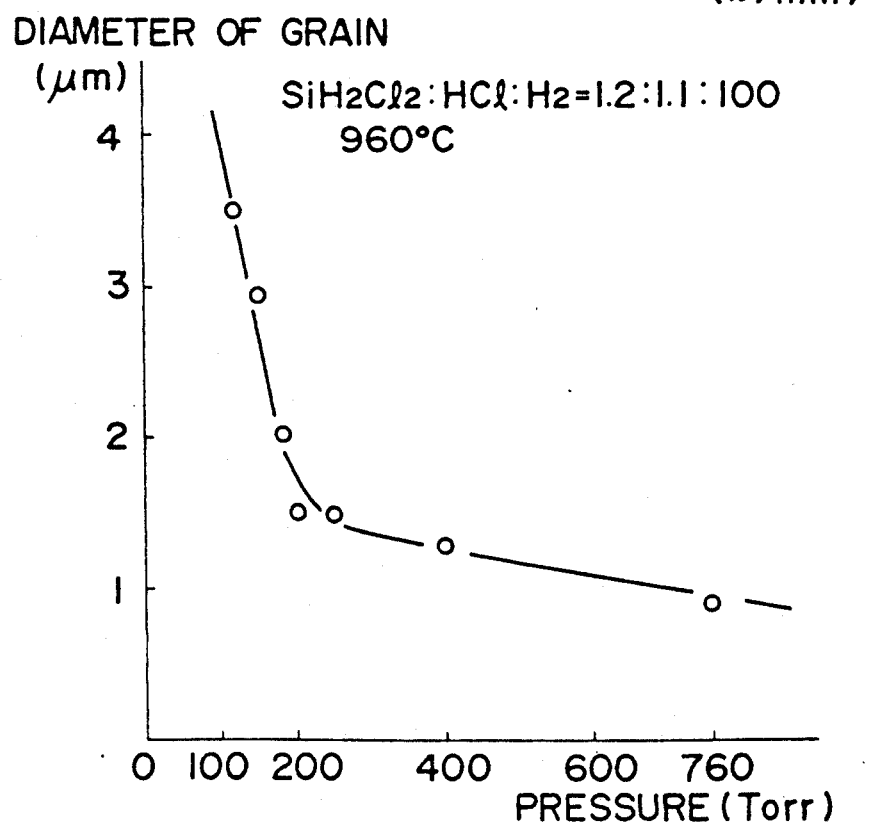
FIG. 10 is a chart showing the influence of pressure on the crystal size of large-grain polycrystalline silicon film.

FIG. 10 shows the pressure dependence of the average grain size. The depositing conditions are same as those shown in FIG. 9, except that the HCl flow rate is 1.1 l/min. A lower pressure reduces the nucleation density and provides a more uniform distribution of nuclei, thus giving rise to more uniform grain size. Other conditions employed were $SiH_2Cl_2:HCl:H_2 = 1.2:1.1:100$ (l/min), a temperature of 960° C. and a deposition time of 30 minutes. The effect of lower pressure is particularly evident at 200 Torr or lower.

Figure 11:
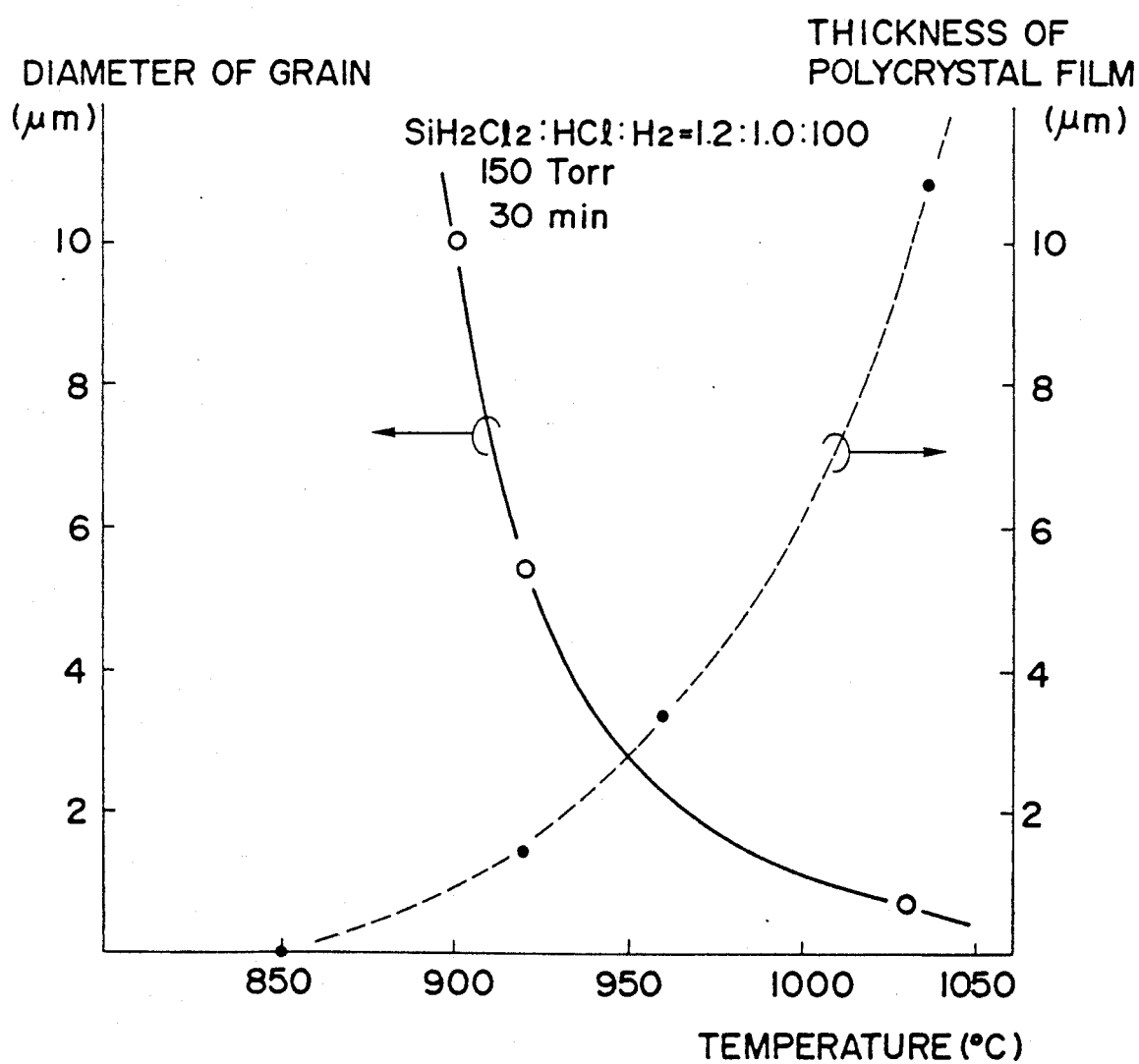
FIG. 11 is a chart showing the influence of temperature on the nucleation density of large-grain polycrystalline silicon film.

FIG. 11 shows the temperature dependence of the average grain size and the deposited film thickness. Other depositing conditions employed were $SiH_2Cl_2:HCl:H_2=1.2:10:100$ (l/min), a pressure of 150 Torr and a deposition time of 10 minutes. The average grain size increases as the temperature is lowered from 1000° C. However, as will be apparent from the curve of the deposited film thickness, the growth rate decreases simultaneously and becomes almost zero at 850° C. Consequently the lower temperature limit is determined by the growth rate. The crystalline nature of each grain is naturally better at a higher temperature, so that a suitable temperature can be selected according to the device specifications.

The foregoing explanation is limited to the use of $SiH_2Cl_2$ as the source gas, but similar tendencies can be obtained with other silicon-containing source gases such as $SiHCl_3$, $SiH_2$ or $SiCl_4$. Also a same process is applicable to a compound semiconductor such as GaAs by employing a 60:1 mixture of trimethyl gallium (TMG) and arsine ($AsH_3$). In this case the deposition can be conducted with $H_2$ as the carrier gas, with a temperature equal to or higher than 600° C. and a pressure of 10 to 20 Torr.

In addition to HCl, the nucleation density controlling gas can be composed of $Cl_2$, $F_2$, $CCl_4$ or $CCl_2F_2$ which react with the semiconductor material.

The surface of the large-grain polycrystalline silicon film formed on a transparent quartz substrate as explained above, was subjected to mechanochemical polishing and to the preparation of a p-channel MOS-FET. There was obtained a hole mobility of about 70 $cm^2/V.sec$ which is significantly higher than that in the ordinary polycrystalline silicon film.

Thus a high speed image reading is possible even when an array is formed with a large number of phototransistors.

In case an i-type semiconductor layer is employed, the channel area is preferably doped lightly with an n-type impurity.

As explained in the foregoing, the present embodiment provides a photosensor device which shows a high photosensitivity at the short wavelength due to the use of a horizontal type photodiode, which is capable of transmitting weak photocurrent without loss in the wirings because the highly doped area (P+) of the photodiode constitutes the drain area of the MOS-FET, and which can be produced with a very limited number of diffusion steps.

Second Embodiment

Figure 3:
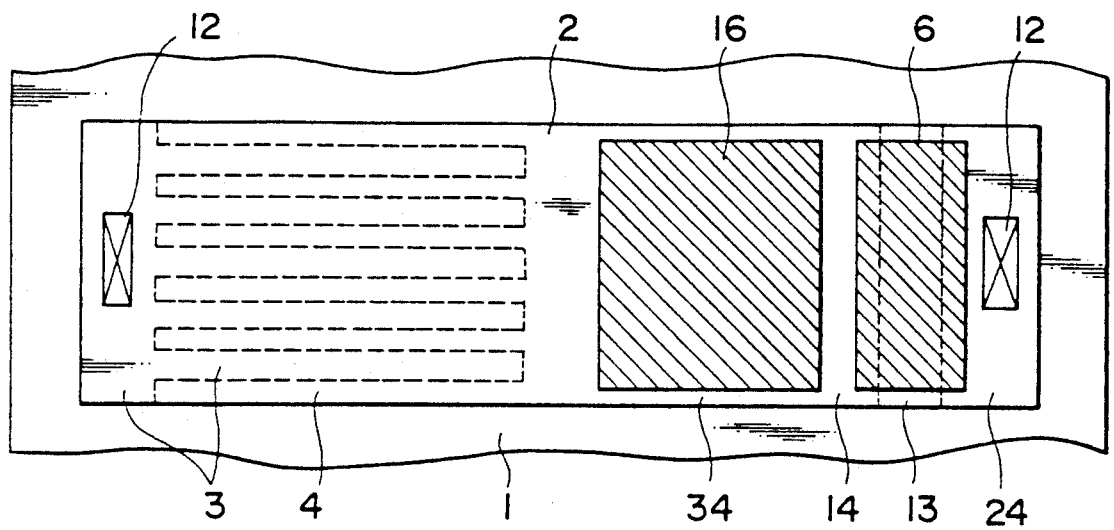
FIG. 3 is a plan view of a photosensor device constituting a second embodiment of the present invention.
Figure 4:
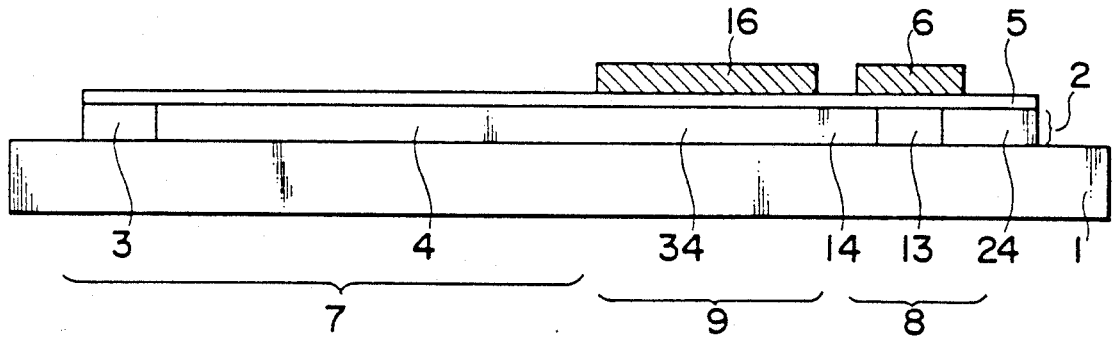
FIG. 4 is a cross-sectional view of the device shown in FIG. 3.
Figure 5:
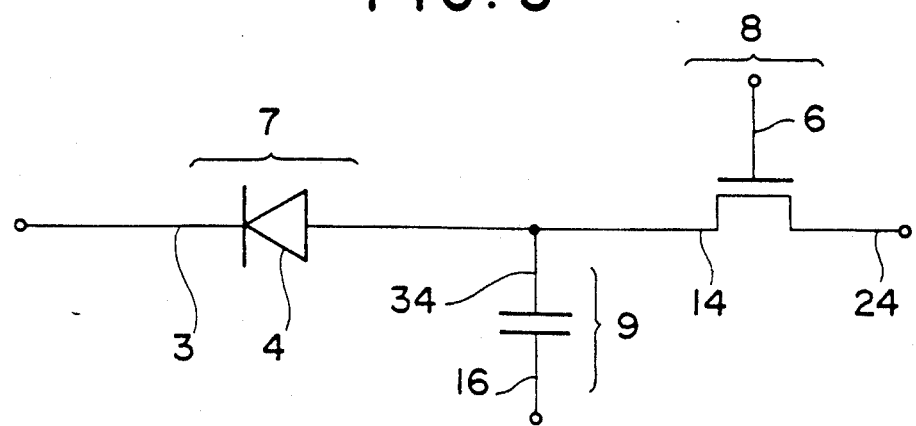
FIG. 5 is an equivalent circuit diagram of the photosensor device shown in FIG. 3.

FIG. 3 is a plan view of a second embodiment of the present invention, while FIG. 4 is a cross-sectional view of the device shown in FIG. 3, and FIG. 5 is an equivalent circuit diagram of the device shown in FIG. 3.

In FIG. 3, an n-type semiconductor film 2 is doped with boron to simultaneously form P+-areas within a sensor area 4, source and drain areas 14, 24 and a MOS capacitance area 34. Then, after the formation of a gate insulator films, a gate 16 of the MOS capacitance and a gate 6 of the MOS-FET are formed with n+-type polycrystalline silicon or n+-type amorphous silicon. There are provided contacts 12 for wiring.

In the present embodiment, as shown by the equivalent circuit in FIG. 5, there is provided a capacitance 9 for accumulating the photocurrent. It is therefore suitable for a sensor array in which weak photocurrents are temporarily stored and sequentially read. Also the present embodiment reduces the steps for wiring and the leakage of signal, and can effectively utilize the area of the substrate since the P+-area 4 of the sensor, the P+-area 34 of the MOS capacitance and the drain 14 of the MOS-FET are composed of a common diffusion area. Therefore the present embodiment is advantageous for a higher production yield.

The structure of the sensor array is not shown in the foregoing embodiments, but a sensor array can be basically obtained by parallel arrangement of the device shown in FIG. 1 or 3. In this case each element has to be electrically insulated except the n-type area 3 of the sensor, so that the semiconductor film of each element has to be separated, for example by etching, from that of the neighboring elements.

In the foregoing explanation, the n-type layer and the p-type layer may be mutually exchanged, and in such case, the intrinsic layer is used as a low concentration layer.

Third Embodiment

FIGS. 6A to 6D are cross-sectional views showing the process steps of a third embodiment of the present invention.

In the following there will be explained the manufacturing process, with reference to FIGS. 6A to 6D.

Figure 6A:
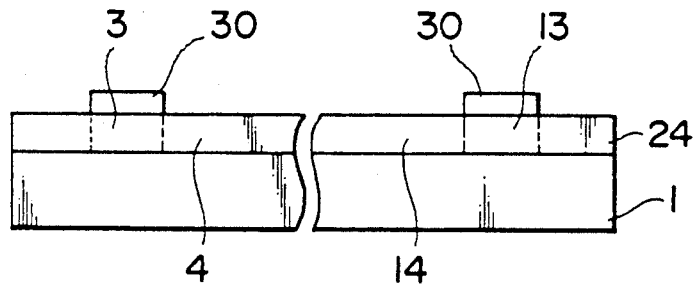
FIGS. 6A to 6D are cross-sectional views showing manufacturing steps of a third embodiment of the present invention.
Figure 6B:
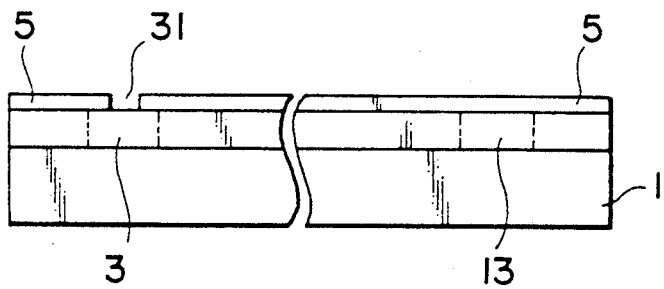
Figure 6C:
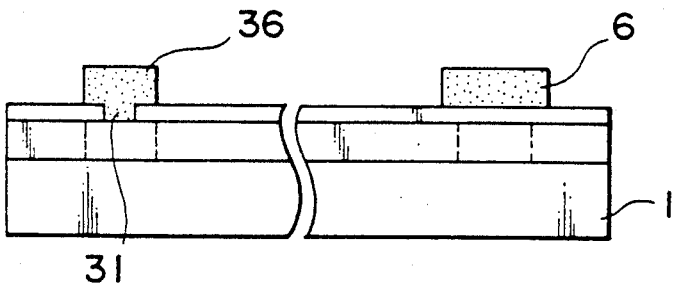
Figure 6D:
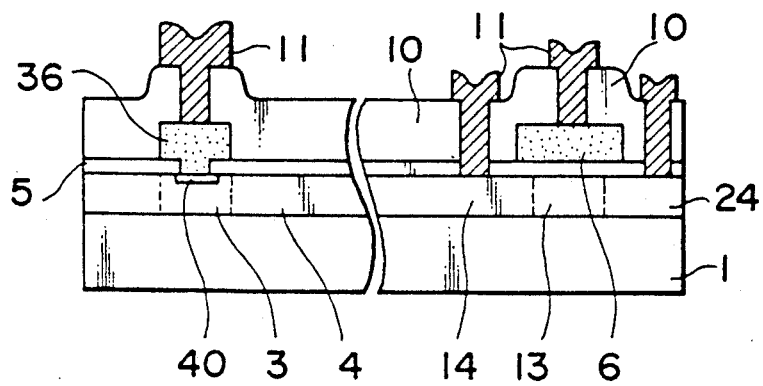

On a transparent insulating substrate 1, there is deposited an n-type or i-type semiconductor layer 24 of low concentration. Then a mask 30 for impurity diffusion or ion implantation is formed in predetermined areas, and p-type areas are formed by the diffusion of a p-type impurity in the areas not covered by said mask (FIG. 6A). After the elimination of the mask, a gate oxide film 5 is formed, and a contact hole 31 is formed in a desired position in the n- or i-type area (FIG. 6B). Subsequently an n+-type polycrystalline silicon of high concentration or amorphous silicon is deposited thereon, and is eliminated by etching excluding a contact portion 36 and a gate portion 6 (FIG. 6C). Then an interlayer insulating film 10 is deposited on the entire area. There are formed a second contact hole and an electrode 11 (FIG. 6D).

Thermal annealing in the process causes the diffusion of an n-type impurity from the n+-type polycrystalline silicon (or n+-type amorphous silicon) layer 36 of high concentration into the n- or i-type area of low concentration, thereby forming an n+-type area 40.

The above-explained process provided a photosensor device with satisfactory ohmic contact. The process of the present embodiment is capable of providing reliable contact with fewer process steps, without the additional n-type diffusion of high concentration required in the conventional process.

As explained in the foregoing, the present embodiment is capable of forming a switch and a processing circuit together with a photosensor on a transparent insulating substrate with a reduced number of steps, thereby easily providing a photosensor device of wide application.

Besides, since the photosensor is horizontal type, the junctions can be easily formed in a stripe pattern, and the area of the sensor can be effectively utilized.

Also the sensor array obtained with the present embodiment can be utilized for realizing a high-speed image reader.

Fourth Embodiment

Figure 12:
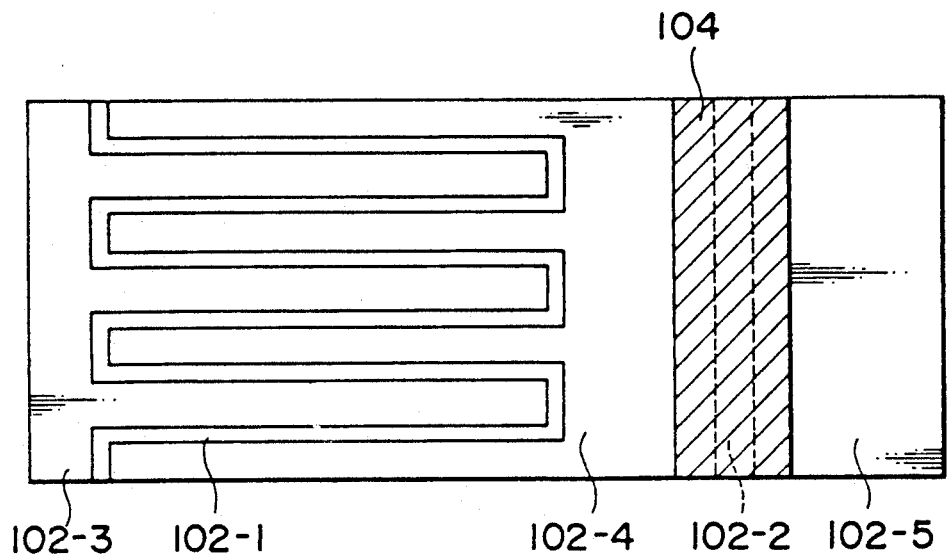
FIG. 12 is a plan view of a device constituting a fourth embodiment of the present invention.
Figure 13:
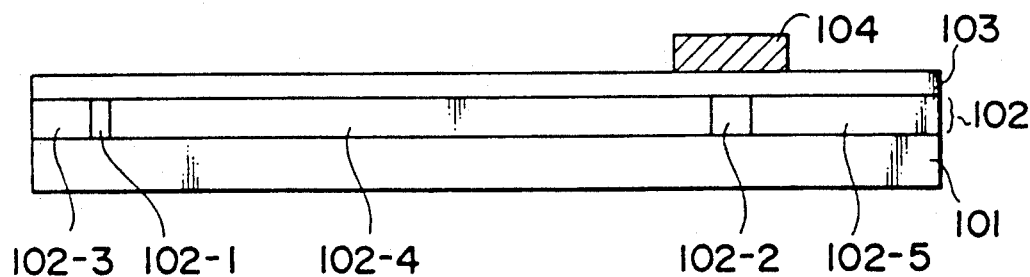
FIG. 13 is a cross-sectional view of the device shown in FIG. 12.
Figure 14:
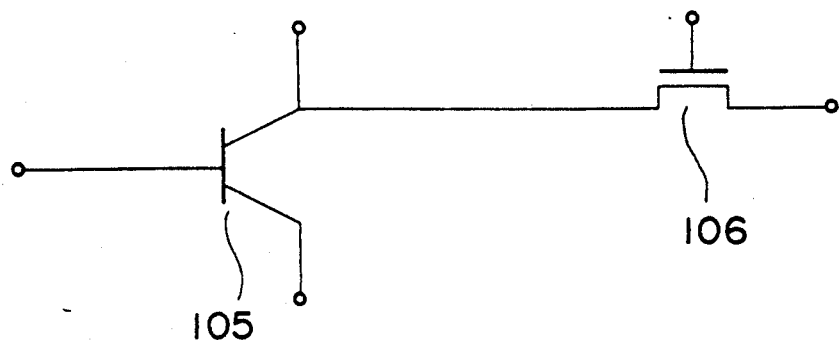
FIG. 14 is an equivalent circuit diagram of the device shown in FIG. 12.

FIGS. 12 and 13 are respectively a plan view and a lateral view of a fourth embodiment of the present invention, and FIG. 14 is an equivalent circuit diagram of the device shown in FIG. 12.

In FIGS. 12 and 13, in desired areas of a semiconductor layer 102 of a first conductive type, there are formed semiconductor layers 102-3, 102-4, 102-5 of a second conductive type. The layers 102-3 and 102-4 constitute emitter and collector of a phototransistor 105 shown in FIG. 14, and the layer 102-4 and 102-5 constitute source and drain of a MOS transistor 106. Base 102-1 of the phototransistor 105 and channel area 102-2 of the MOS transistor 106 are composed of the semiconductor layer of the first conductive type. In order to maximize the light receiving area, the phototransistor is constructed in a rectangular wave form.

As shown in FIG. 12, an n-type or i-type semiconductor film 102 is formed on a substrate 101. The substrate is composed of a transparent substrate such as quartz or glass, if the device receives the light through the substrate. The semiconductor film is composed of polycrystalline silicon or monocrystalline silicon. The polycrystalline silicon is preferably, rather than usual polycrystalline silicon of a grain size of 500 Å or lower deposited by low pressure CVD from silane ($SiH_4$) gas, the large-grain polycrystalline silicon proposed by the present applicant in the Japanese Patent Applications Nos. 62-73629 and 62-73630 for obtaining a photosensor device of high performance.

The monocrystalline silicon can be recrystallized by laser annealing or by monocrystalline growth from a seed composed of a small $Si_3N_4$ pattern on $SiO_2$ followed by crystal flattening. The large-grain polycrystalline silicon is most suitable for the present embodiment because of ease of formation, as will be explained later. The n-type or i-type semiconductor film thus formed is subjected to the diffusion of a p-type impurity, such as boron, in desired areas. Thus there are simultaneously formed the emitter and collector of the phototransistor and the source and drain of the MOS-FET.

The phototransistor is composed of a horizontal $p^+$-n (or i)-$p^+$ transistor. Such horizontal phototransistor has a high spectral sensitivity at the shorter wavelength (blue side), because the carriers generated at the surface by the light of short wavelength can be utilized without immediate recombination due to the absence of a high concentration layer at the surface of the n- or i-type base area. Also in the large-grain polycrystalline silicon mentioned above, the width of the base area should be as small as possible for obtaining a large signal current as the diffusion length of the carriers is not so large.

In the MOS-FET, source and drain of $p^+$-type are formed across an n-type or i-type channel area, and a gate electrode 104 is formed on a gate insulating film 103 of a thickness of about 1000 Å. The gate insulating film 103 is preferably composed of a thermally oxidized semiconductor film in consideration of the functional characteristic, but a $SiO_2$ film formed by low pressure CVD or $Si_3N_4$ film formed by plasma CVD in terms of cost. Also the gate electrode is formed by depositing an $n^+$-type polycrystalline silicon or aluminum and patterning it on the channel area 102-5, as shown in FIG. 12, with a registration margin to partially cover the source and drain 102-4, 102-5. In FIG. 12 the gate insulating film 103 is omitted.

As will be apparent from the equivalent circuit shown in FIG. 14, in the photosensor device of the present embodiment, the phototransistor of the above-explained structure is biased between the emitter 102-3 and the collector 102-4 in such a manner that the base 102-1 and the collector 102-4 are inversely biased, and the base area is irradiated with light. Thus pairs of electrons and holes are generated in the base area, and the carriers of one kind diffuse into the collector area due to the inverse bias between the base and the collector, while those of the other kind are accumulated in the base area. If a current is supplied from the emitter in this state, it flows to the collector due to the effect of the carriers accumulated in the base area. The collector current in this state is about $h_{fe}$ times of the photocurrent generated between the base and the collector, so that a very weak light signal can also be detected. The collector current thus obtained is supplied to the drain 102-5 and processed therein by turning on the MOS transistor.

The process of forming said large-grain polycrystalline silicon is same as that already explained in reference to FIGS. 7 to 11, and will not, therefore, be explained again.

Fifth Embodiment

Figure 15:
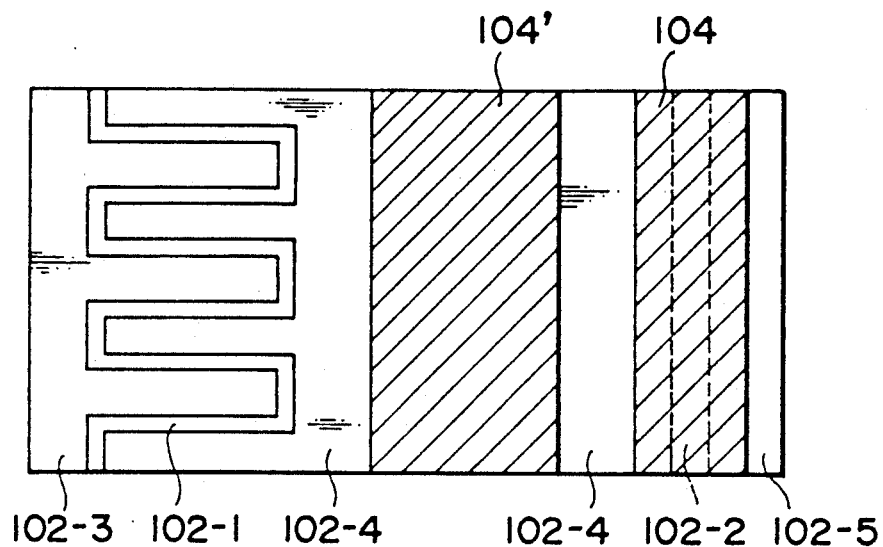
FIG. 15 is a plan view showing a fifth embodiment of the present invention.
Figure 16:
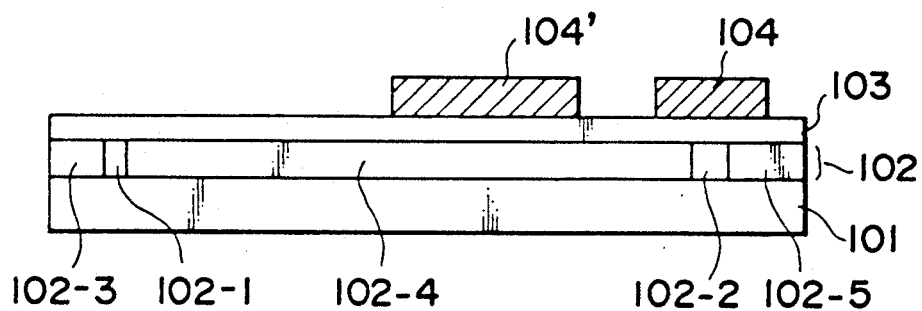
FIG. 16 is a cross-sectional view of the device shown in FIG. 15.
Figure 17:
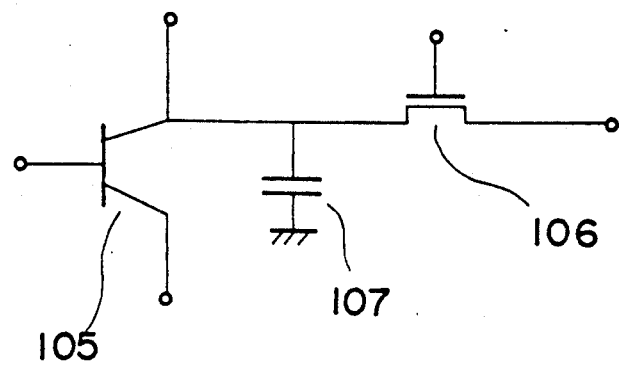
FIG. 17 is an equivalent circuit diagram of the device shown in FIG. 15.

FIG. 15 is a plan view of a fifth embodiment of the present invention, FIG. 16 is a lateral view of the device shown in FIG. 15, and FIG. 17 is an equivalent circuit diagram of the device shown in FIG. 15.

In the present embodiment, an MOS capacitance 107 is formed on an area 102-4 constituting the collector of the phototransistor 105 and the source of the MOS transistor 106, whereby the photocarriers generated by the phototransistor 105 in response to light can be temporarily stored in said MOS capacitance 107 and supplied to a processing circuit by sequentially turning on the MOS transistors 6. The present embodiment is therefore suitable for detecting a very small current. The present embodiment can reduce the steps of wirings and the current leak and effectively utilize the area, since the collector of the phototransistor, the $p^+$-area of the MOS capacitance and the drain of the MOS-FET are composed of a common doped area. Thus the present embodiment can achieve a high production yield and is therefore advantageous for manufacture.

The structure of the sensor array has not been shown in the foregoing fourth and fifth embodiments, but a sensor array can be basically obtained by a parallel arrangement of the element shown in FIGS. 12 or 15. In this case, each element has to be electrically insulated from the neighboring elements except for n- or i-type area 102-1 of the sensor, and this can be achieved by separating the semiconductor film of each element for example by etching from that of the neighboring elements.

The present embodiment enables a simplified process and a lower cost, since the phototransistor and the signal processing circuit therefor can be simultaneously formed by an impurity diffusing step.

Also the present embodiment enables easy formation of a phototransistor capable of detecting a very weak light signal.

Furthermore, the use of horizontal structure for the device has a rectangular wave form at the junction of the phototransistor, thereby achieving effective utilization of the light receiving area.

We claim:
1. A photosensor device comprising:
a semiconductor layer disposed on a substrate,
wherein said semiconductor layer comprises a lateral photosensor having a semiconductor junction ar- ranged in a serpentine configuration and a lateral read-out switch, wherein said lateral photosensor comprises at least an area of a semiconductor of a first conductivity type and an area of a semiconductor of a second conductivity type, wherein said lateral photosensor and said lateral read-out switch are laterally adjacent, and substantially coplanar on the substrate, and wherein said lateral read-out switch comprises at least an area of the first conductivity type and an area of the second conductivity type.

2. A photosensor device according to claim 1, wherein said lateral photosensor comprises a light receiving portion arranged and constructed in a pattern having plural stripes.

3. A photosensor device according to claim 1, wherein said semiconductor layer comprises polycrystalline silicon having a grain size of at least 0.5 $\mu$m.

4. A photosensor device according to claim 1, wherein said lateral read-out switch comprises a base arranged and constructed in a rectangular serpentine form.

5. A photosensor device according to claim 4, wherein said semiconductor layer formed on the insulating substrate comprises polycrystalline silicon having a grain size of at least 0.5 $\mu$m.

6. A photosensor device according to claim 1, wherein the first conductivity type is n-type.

7. A photosensor device according to claim 1, wherein the first conductivity type is i-type.

8. A photosensor device according to claim 1, wherein the first conductivity type is p-type.

9. A photosensor device according to claim 1, wherein said lateral photosensor comprises a photodiode.

10. A photosensor device according to claim 1, wherein said lateral photosensor further comprises a phototransistor formed using a further area of a semiconductor of the second conductivity type in combination with said first-mentioned area of the semiconductor of the first conductivity type and said first-mentioned area of the semiconductor of the second conductivity type.

11. A photosensor device according to claim 1, wherein said lateral read-out switch comprises a FET transistor.

12. A photosensor device according to claim 1, wherein said lateral photosensor and said lateral read-out switches are formed integrally with each other.

13. A photosensor device according to claim 1, further comprising a capacitor for storing at least one signal.

14. A photosensor device to claim 1, wherein said photosensor device is a photosensor array comprising a plurality of lateral photosensors and a plurality of read-out switches.

15. A photosensor device comprising:
a photosensor section formed on a substrate; and
a switch section for reading out at least one signal photoelectrically converted by said photosensor section, said switch section being formed on the substrate, (a) wherein said photosensor section has at least a first semiconductor area of a first conductivity type and a second semiconductor area of a second conductivity type, the second conductivity type being different from the first conductivity type, said first and second semiconductor areas being adjacent so as to form a semiconductor junction arranged in a serpentine configuration, (b) wherein said switch section has a third semiconductor area of the first conductivity type, a fourth semiconductor area of the second conductivity type, and a fifth semiconductor areas of the first conductivity type, the third and fifth semiconductor areas sandwiching the fourth semiconductor area, and (c) wherein said photosensor section and said switch section are laterally adjacent, and substantially coplanar, on the substrate.

16. A photosensor device according to claim 15, wherein the first conductivity type is n-type.

17. A photosensor device according to claim 15, wherein the first conductivity type is i-type.

18. A photosensor device according to claim 15, wherein the second conductivity type is p-type.

19. A photosensor device according to claim 15, wherein said photosensor section comprises a photodiode.

20. A photosensor device according to claim 15, wherein said photosensor section further comprises a phototransistor formed using a sixth semiconductor area of the second conductivity type in combination with said first semiconductor area of the first conductivity type and said second semiconductor area of the second conductivity type.

21. A photosensor device according to claim 15, wherein said switch section is a FET transistor.

22. A photosensor device according to claim 15, wherein said second and third semiconductor areas are formed integrally with each other.

23. A photosensor device according to claim 15, further comprising a capacitor for storing at least one signal.

24. A photosensor device according to claim 15, wherein said photosensor device comprises a photosensor array having a plurality of photosensor sections and a plurality of switch sections.

* * * * *

UNITED STATES PATENT AND TRADEMARK OFFICE
CERTIFICATE OF CORRECTION

PATENT NO. : 5,043,785

DATED : August 27, 1991

INVENTOR(S) : HIDEMASA MIZUTANI, ET AL.

It is certified that error appears in the above-identified patent and that said Letters Patent is hereby corrected as shown below:

ON THE TITLE PAGE,
IN [56] REFERENCES CITED

OTHER PUBLICATIONS, Under Seager et al., "Appl. Phys. Lett., 3415)," should read --Appl. Phys. Lett., 34 (5),--.

COLUMN 1

Line 30, "slow response" should read --slow in response--.

COLUMN 3

Line 48, "n- or" should read --n-type or--.

COLUMN 8

Line 33, "MOS transistors 6." should read --MOS transistor 106.--.

COLUMN 9

Line 50, "switches" should read --switch--.

UNITED STATES PATENT AND TRADEMARK OFFICE
CERTIFICATE OF CORRECTION

PATENT NO. : 5,043,785

DATED : August 27, 1991

INVENTOR(S) : HIDEMASA MIZUTANI, ET AL.

It is certified that error appears in the above-identified patent and that said Letters Patent is hereby corrected as shown below:

COLUMN 10

Line 20, "areas" should read --area--

Signed and Sealed this

Sixteenth Day of March, 1993

Attest:

STEPHEN G. KUNIN

*Attesting Officer*    Acting Commissioner of Patents and Trademarks